(12) United States Patent
Li et al.

(10) Patent No.: US 11,251,208 B2
(45) Date of Patent: Feb. 15, 2022

(54) PHOTOSENSOR, DISPLAY APPARATUS, AND METHOD OF FABRICATING PHOTOSENSOR

(71) Applicant: BOE Technology Group Co., Ltd., Beijing (CN)

(72) Inventors: Chao Li, Beijing (CN); Jianhua Du, Beijing (CN); Feng Guan, Beijing (CN); Zhaohui Qiang, Beijing (CN); Zhi Wang, Beijing (CN); Yupeng Gao, Beijing (CN); Yang Lv, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/642,734

(22) PCT Filed: Mar. 18, 2019

(86) PCT No.: PCT/CN2019/078508
§ 371 (c)(1),
(2) Date: Feb. 27, 2020

(87) PCT Pub. No.: WO2020/186425
PCT Pub. Date: Sep. 24, 2020

(65) Prior Publication Data
US 2021/0151476 A1  May 20, 2021

(51) Int. Cl.
*H01L 27/144* (2006.01)
*H01L 27/12* (2006.01)
(Continued)

(52) U.S. Cl.
CPC ...... *H01L 27/1443* (2013.01); *H01L 27/1259* (2013.01); *H01L 31/03529* (2013.01); *H01L 31/105* (2013.01); *H01L 31/18* (2013.01)

(58) Field of Classification Search
CPC ............. H01L 27/1443; H01L 27/1259; H01L 31/03529; H01L 31/105; H01L 31/18;
(Continued)

(56) References Cited

U.S. PATENT DOCUMENTS 10,162,462 B2  12/2018  Shen
2013/0082267 A1   4/2013  Aichi
(Continued)

FOREIGN PATENT DOCUMENTS

CN  105789226 A  7/2016
CN  108447937 A  8/2018
(Continued)

OTHER PUBLICATIONS

International Search Report & Written Opinion dated Nov. 28, 2019, regarding PCT/CN2019/078508.

*Primary Examiner* — Duy T Nguyen
(74) *Attorney, Agent, or Firm* — Intellectual Valley Law, P.C.

(57) ABSTRACT

A photosensor includes a base substrate; an insulating layer on the base substrate; and a photodiode including a semiconductor junction on a side of the insulating layer away from the base substrate. The semiconductor junction includes a first polarity semiconductor layer, an intrinsic semiconductor layer, and a second polarity semiconductor layer, stacked on the insulating layer. The second polarity semiconductor layer encapsulates a lateral surface of the intrinsic semiconductor layer.

17 Claims, 8 Drawing Sheets

(51) Int. Cl.
*H01L 31/0352* (2006.01)
*H01L 31/105* (2006.01)
*H01L 31/18* (2006.01)

(58) Field of Classification Search
CPC ......... H01L 27/14643; H01L 27/14683; H01L 27/14612
USPC ........................................................ 257/290
See application file for complete search history.

(56) References Cited

U.S. PATENT DOCUMENTS

2013/0306873 A1\* 11/2013 Jun ........................ G01T 1/2006
    250/361 R
2014/0110753 A1\* 4/2014 Mouli ............... H01L 29/66916
    257/183
2015/0171135 A1\* 6/2015 Jun ................... H01L 27/14632
    250/366

FOREIGN PATENT DOCUMENTS

CN   207764816   \*  8/2018
CN   207764816  U   8/2018

\* cited by examiner ions of the second electrode on the base substrate substantially surrounds an orthographic projection of the semiconductor junction on the base substrate.

PHOTOSENSOR, DISPLAY APPARATUS, AND METHOD OF FABRICATING PHOTOSENSOR

CROSS-REFERENCE TO RELATED APPLICATION

This application is a national stage application under 35 U.S.C. § 371 of International Application No. PCT/CN2019/078508, filed Mar. 18, 2019, the contents of which are incorporated by reference in the entirety.

TECHNICAL FIELD

The present invention relates to photo-sensing and display technology, more particularly, to a photosensor, a display apparatus, and a method of fabricating a photosensor.

BACKGROUND

In recent years, display apparatuses are made to integrate photosensors to realize various functions such as photo-sensing, biometric information detection, and human-machine interaction. For example, a smart phone typically includes a fingerprint sensor to detect and recognize a user's fingerprint.

SUMMARY

In one aspect, the present invention provides a photosensor, comprising a base substrate; an insulating layer on the base substrate; and a photodiode comprising a semiconductor junction on a side of the insulating layer away from the base substrate, the semiconductor junction comprising a first polarity semiconductor layer, an intrinsic semiconductor layer, and a second polarity semiconductor layer stacked on the insulating layer, wherein the second polarity semiconductor layer encapsulates a lateral surface of the intrinsic semiconductor layer.

Optionally, the second polarity semiconductor layer is in direct contact with the insulating layer.

Optionally, an intermediate surface of the intrinsic semiconductor layer is in direct contact with the insulating layer, and the intermediate surface of the intrinsic semiconductor layer connects the first polarity semiconductor layer and the second polarity semiconductor layer.

Optionally, an orthographic projection of the intrinsic semiconductor layer on the base substrate completely covers an orthographic projection of the first polarity semiconductor layer on the base substrate; and an orthographic projection of the second polarity semiconductor layer on the base substrate completely covers the orthographic projection of the intrinsic semiconductor layer on the base substrate.

Optionally, the photosensor further comprises a first electrode between the base substrate and the first polarity semiconductor layer; wherein the first electrode is connected to the first polarity semiconductor layer through a via extending through the insulating layer.

Optionally, the photosensor further comprises a substantially transparent conductive layer on a side of the second polarity semiconductor layer away from the base substrate; wherein the substantially transparent conductive layer encapsulates a lateral surface of the second polarity semiconductor layer.

Optionally, the photosensor further comprises a second electrode connected to the second polarity semiconductor layer through the substantially transparent conductive layer; wherein an orthographic projection of the second electrode on the base substrate substantially surrounds an orthographic projection of the semiconductor junction on the base substrate.

Optionally, the orthographic projection of the second electrode on the base substrate is substantially non-overlapping with the orthographic projection of the semiconductor junction on the base substrate.

Optionally, the second polarity semiconductor layer is made of an oxide semiconductor material.

Optionally, the first polarity semiconductor layer is a P+ doping semiconductor region, the second polarity semiconductor layer is an N+ doping semiconductor region, and the intrinsic semiconductor layer is an intrinsic region of amorphous silicon between the P+ doping semiconductor region and the N+ doping semiconductor region.

Optionally, the photosensor further comprises a transistor connected to the photodiode; wherein the transistor comprises a gate electrode, a gate insulating layer, an active layer, a source electrode, and a drain electrode; and the insulating layer is the gate insulating layer.

Optionally, the photosensor further comprises a first electrode on the base substrate and on a side of the insulating layer away from the first polarity semiconductor layer, wherein the first electrode is connected to the first polarity semiconductor layer through a via extending through the insulating layer; and the first electrode and the gate electrode are in a same layer and comprise a same material.

Optionally, the active layer and the second polarity semiconductor layer are in a same layer and comprise a same material.

Optionally, the photosensor further comprises a substantially transparent conductive layer on a side of the second polarity semiconductor layer away from the semiconductor junction, and covering a source electrode contact region and a drain electrode contact region of the active layer; wherein the substantially transparent conductive layer encapsulates a lateral surface of the second polarity semiconductor layer.

Optionally, the photosensor further comprises a second electrode connected to the second polarity semiconductor layer through the substantially transparent conductive layer; wherein an orthographic projection of the second electrode on the base substrate substantially surrounds an orthographic projection of the semiconductor junction on the base substrate; the source electrode, the drain electrode, and the second electrode are in a same layer and comprise a same material; and the source electrode and the second electrode are connected to each other.

Optionally, the source electrode and the second electrode constitute an integral structure.

Optionally, the photosensor further comprises a protective layer covering a channel region of the active layer.

In another aspect, the present invention provides a display apparatus, comprising the photosensor described herein, and a plurality of subpixels for image display.

In another aspect, the present invention provides a method of fabricating a photosensor, comprising forming an insulating layer on a base substrate; and forming a semiconductor junction on a side of the insulating layer away from the base substrate; wherein forming the semiconductor junction comprises forming a first polarity semiconductor layer on the insulating layer; forming an intrinsic semiconductor layer on a side of the first polarity semiconductor layer away from the insulating layer; and forming a second polarity semiconductor layer on a side of the intrinsic semiconductor layer away from the first polarity semiconductor layer;

wherein the second polarity semiconductor layer is formed to encapsulate a lateral surface of the intrinsic semiconductor layer.

Optionally, the method further comprises forming a transistor connected to the semiconductor junction; wherein forming the transistor comprises forming a gate electrode, forming a gate insulating layer, forming an active layer, forming a source electrode, and forming a drain electrode; and the insulating layer is the gate insulating layer; wherein the method comprises forming the gate electrode and a first electrode in a same layer using a same material and a single mask plate; forming the insulating layer on a side of the gate electrode and the first electrode away from the base substrate; forming a via extending through the insulating layer; forming the first polarity semiconductor layer on a side of the insulating layer away from the first electrode, the first polarity semiconductor layer formed to be connected to the first electrode through the via extending through the insulating layer, forming the intrinsic semiconductor layer on a side of the first polarity semiconductor layer away from the insulating layer; forming the second polarity semiconductor layer and the active layer in a same layer using a same material and a single mask plate, the active layer formed to be on a side of the insulating layer away from the gate electrode, the second polarity semiconductor layer formed to be on a side of the intrinsic semiconductor layer away from the first polarity semiconductor layer; forming a substantially transparent conductive layer on a side of the second polarity semiconductor layer, and a source electrode contact region and a drain electrode contact region of the active layer, away from the insulating layer; and forming the source electrode, the drain electrode, and a second electrode in a same layer using a same material and a single mask plate, the second electrode formed to be connected to the second polarity semiconductor layer through the substantially transparent conductive layer; wherein the second electrode is formed so that an orthographic projection of the second electrode on the base substrate substantially surrounds an orthographic projection of the semiconductor junction on the base substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
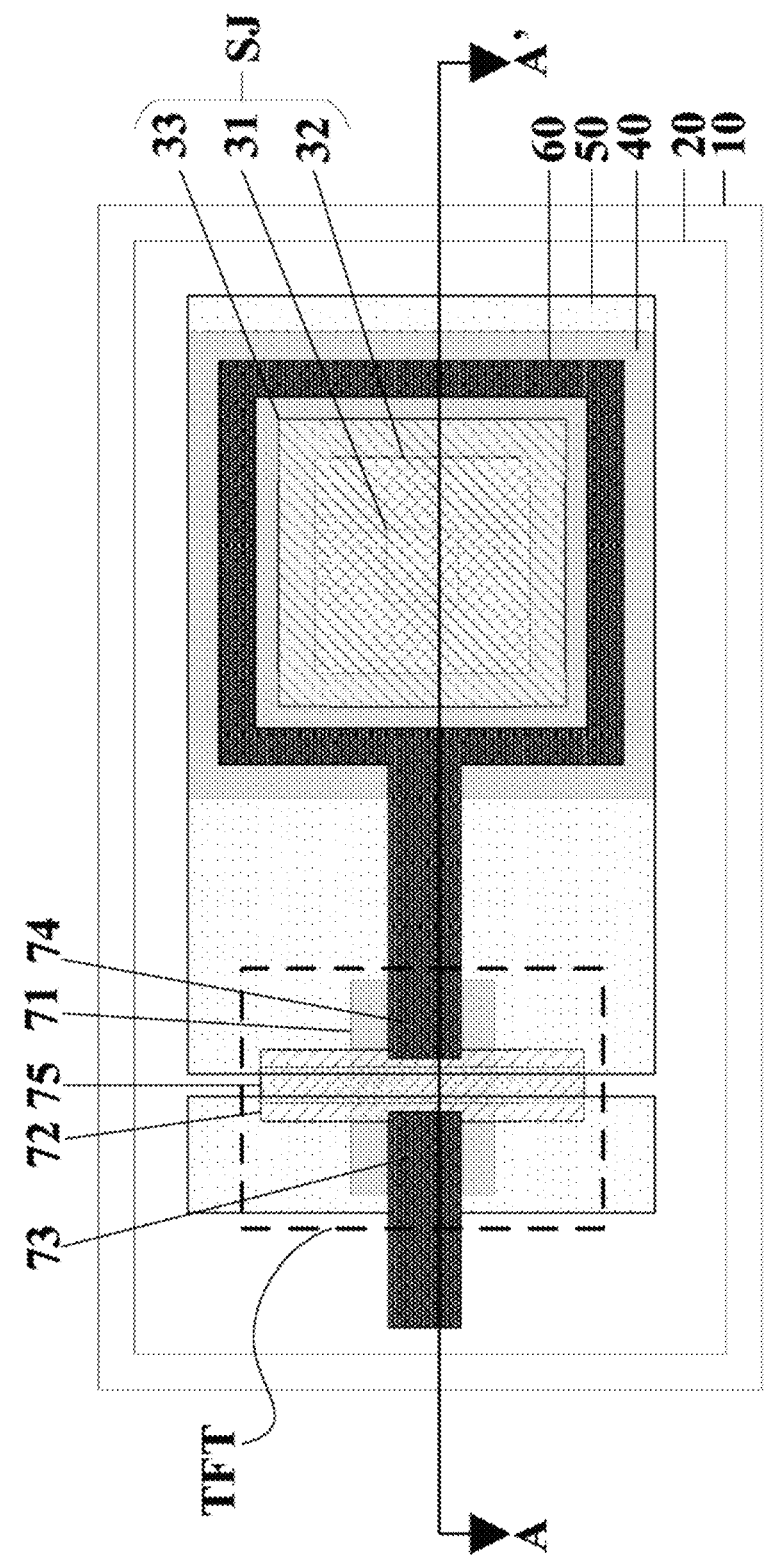
FIG. 1 is a plan view of a photosensor in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Several shortcomings of conventional photosensors are discovered in the present disclosure. In fabricating the conventional photosensors, the semiconductor junction of the photodiode is typically formed by a patterning process. It follows that a lateral surface of the semiconductor junction is formed in the patterning process typically involving an etching process using an etchant. The etching process on the lateral surface of the semiconductor junction can adversely affect the performance of the photosensor. For example, the etching process on the lateral surface of the semiconductor junction often leads to an increased lateral side leak current, an increased dark current of the photosensor, a decreased photo response of the photosensor, to name a few. Moreover, an opaque electrode disposed on the top surface of the semiconductor junction shield light from transmitting into the semiconductor junction, decreasing the effective photosensing area of the photosensor.

Accordingly, the present disclosure provides, inter alia, a photosensor, a display apparatus, and a method of fabricating a photosensor that substantially obviate one or more of the problems due to limitations and disadvantages of the related art. In one aspect, the present disclosure provides a photosensor. In some embodiments, the photosensor includes a base substrate; an insulating layer on the base substrate; and a photodiode including a semiconductor junction on a side of the insulating layer away from the base substrate. Optionally, the semiconductor junction includes a first polarity semiconductor layer, an intrinsic semiconductor layer and a second polarity semiconductor layer stacked on the insulating layer, wherein the second polarity semiconductor layer encapsulates a lateral surface of the semiconductor junction. As used herein, the term "lateral surface" is used in its ordinary sense and refers without limitation to any surface on a lateral side of an object or a component, for example, an outer peripheral wall surface rising on the sides from a bottom surface. In the present photosensor, the second polarity semiconductor layer encapsulates a lateral surface of the semiconductor junction, thus an intermediate surface of the intrinsic semiconductor layer is in direct contact with the insulating layer, and is not affected by the etching process. As compared to the conventional photosensors, the present photosensor has a decreased lateral side leak current, a decreased dark current of the photosensor, and an increased photo response of the photosensor. Moreover, the present photosensor does not require an opaque electrode disposed on the top surface of the semiconductor junction, resulting in an increased effective photo-sensing area of the photosensor.

Figure 2:
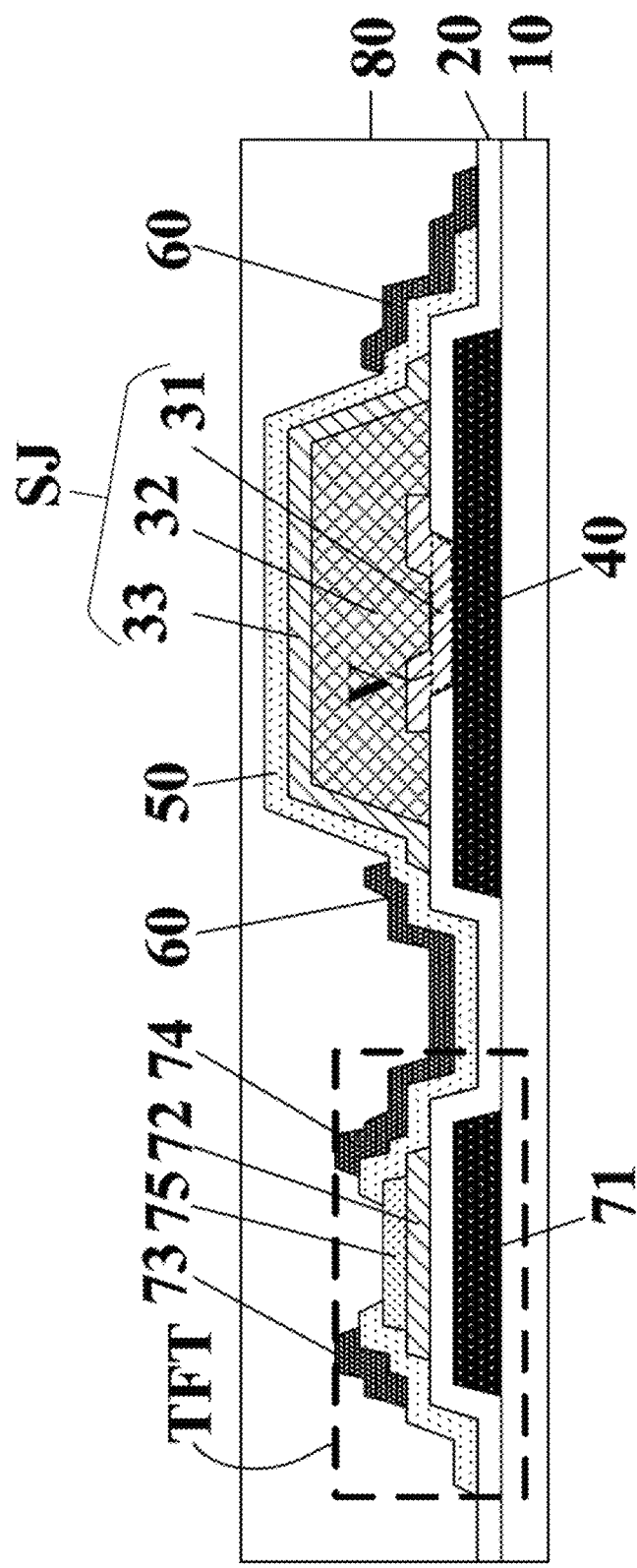
FIG. 2 is a cross-sectional view of a photosensor along an A-A' line in FIG. 1.
Figure 3:
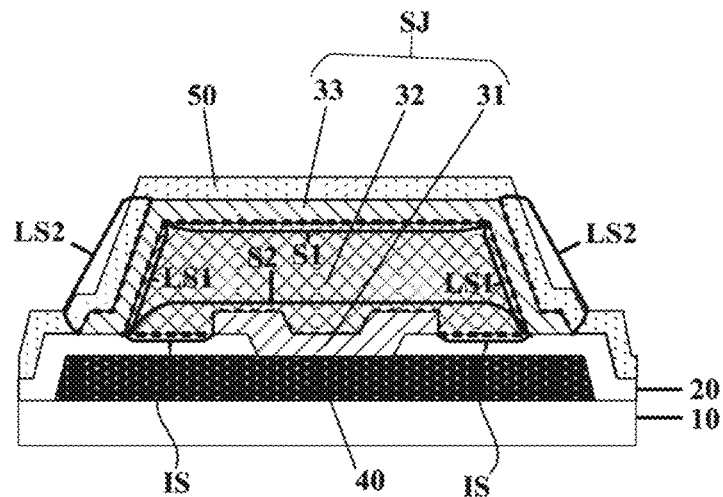
FIG. 3 is a zoom-in partial cross-sectional view of a photosensor in some embodiments according to the present disclosure.

FIG. 1 is a plan view of a photosensor in some embodiments according to the present disclosure. FIG. 2 is a cross-sectional view of a photosensor along an A-A' line in FIG. 1. FIG. 3 is a zoom-in partial cross-sectional view of a photosensor in some embodiments according to the present disclosure. Referring to FIGS. 1 to 3, the photosensor in some embodiments includes a base substrate 10; an insulating layer 20 on the base substrate; and a photodiode including a semiconductor junction SJ on a side of the insulating layer 20 away from the base substrate 10. Optionally, the semiconductor junction SJ includes a first polarity semiconductor layer 31, an intrinsic semiconductor layer 32, and a second polarity semiconductor layer 33 stacked on the insulating layer 20. The second polarity semiconductor layer 33 encapsulates a lateral surface LS1 of the intrinsic semiconductor layer 32. For example, the second polarity semiconductor layer 33 is in direct contact with the insulating layer 20, thereby encapsulating the intrinsic semiconductor layer 32 and the first polarity semiconductor layer 31 together with the insulating layer 20.

In some embodiments, and referring to FIG. 3, the intrinsic semiconductor layer 32 has a first surface S1 (e.g., a top surface) away from the base substrate 10, a second surface S2 (e.g., a bottom surface) opposite to the first surface S1 and closer to the base substrate 10, and the lateral surface LS1 connecting the first surface S1 and the second surface S2.

In some embodiments, one or any combination of the first polarity semiconductor layer 31, the intrinsic semiconductor layer 32, and the second polarity semiconductor layer 33, is in direct contact with the insulating layer 20. Optionally, the second polarity semiconductor layer 33 is in direct contact with the insulating layer 20. Optionally, the intrinsic semiconductor layer 32 is in direct contact with the insulating layer 20. Optionally, the first polarity semiconductor layer 31 is in direct contact with the insulating layer 20. Optionally, each of the first polarity semiconductor layer 31, the intrinsic semiconductor layer 32, and the second polarity semiconductor layer 33 is in direct contact with the insulating layer 20.

In some embodiments, and referring to FIG. 3 in particular, an intermediate surface IS of the intrinsic semiconductor layer 32 is in direct contact with the insulating layer 20. Optionally, the intermediate surface IS of the intrinsic semiconductor layer 32 connects the first polarity semiconductor layer 31 and the second polarity semiconductor layer 33. In one example, the intermediate surface IS of the intrinsic semiconductor layer 32 is connected to the lateral surface of the intrinsic semiconductor layer 32, as shown in FIG. 3. Optionally, the intermediate surface IS of the intrinsic semiconductor layer 32 is a part of the second surface S2, and the remainder of the second surface S2 is in direct contact with the first polarity semiconductor layer 31.

Figure 4:
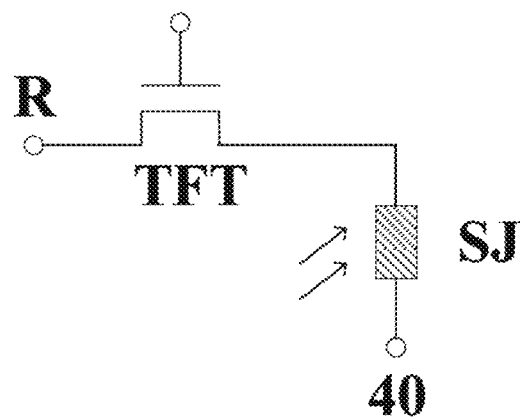
FIG. 4 is a circuit diagram of a photosensor in some embodiments according to the present disclosure.

FIG. 4 is a circuit diagram of a photosensor in some embodiments according to the present disclosure. Referring to FIG. 1 and FIG. 4, the photosensor in some embodiments includes a thin film transistor TFT and a semiconductor junction SJ electrically connected to each other. The source electrode of the thin film transistor TFT is electrically connected to the semiconductor junction SJ. The drain electrode of the thin film transistor TFT is electrically connected to a read line R, which may in turn further connects to other components of the photosensor. The other terminal of the semiconductor junction SJ is connected to a first electrode 40, which may be a common electrode configured to be provided with a common voltage (e.g., a ground voltage).

Various appropriate semiconductor junctions may be utilized in making and using the present photosensor. Examples of semiconductor junction include, but are not limited to, a PN photodiode, a PIN photodiode, an avalanche photodiode, a MIM diode junction, a MIS diode junction, a MOS diode junction, a SIS diode junction, and a MS diode junction.

Figure 5:
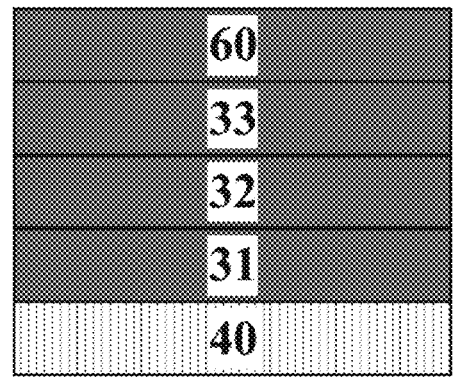
FIG. 5 is a schematic diagram illustrating the structure of a photosensor in some embodiments according to the present disclosure.

FIG. 5 is a schematic diagram illustrating the structure of a photosensor in some embodiments according to the present disclosure. Referring to FIG. 5, the semiconductor junction in some embodiments includes a first polarity semiconductor layer 31 electrically connected to a first electrode 40; a second polarity semiconductor layer 33 electrically connected to a second electrode 60, which in turn is electrically connected to a source electrode of the thin film transistor TFT; and an intrinsic semiconductor layer 32 connecting the first polarity semiconductor layer 31 and the second polarity semiconductor layer 33. As used herein, the term intrinsic semiconductor layer refers to a layer that can exhibit current rectification, e.g., a layer that exhibits drastically different conductivities in one bias direction relative to the other.

Optionally, the photosensor having a semiconductor junction includes a first polarity semiconductor layer having a first dopant, a second polarity semiconductor layer having a second dopant, and an intrinsic semiconductor layer connecting the first polarity semiconductor layer and the second polarity semiconductor layer. Optionally, the photosensor having the semiconductor junction is reversely biased when the first polarity semiconductor layer is connected to a low voltage and the second polarity semiconductor layer is connected to a high voltage. For example, the photosensor having a semiconductor junction is in a reversely biased state when the first polarity semiconductor layer is connected to a common electrode (low voltage, e.g., −5 V to 0 V). In some embodiments, the photosensor having a semiconductor junction is a PN junction having a P+ doping semiconductor region as the first polarity semiconductor layer and an N+ doping semiconductor region as the second polarity semiconductor layer. In some embodiments, the photosensor having a semiconductor junction is a PIN photodiode having a P+ doping semiconductor region as the first polarity semiconductor layer, an N+ doping semiconductor region as the second polarity semiconductor layer, and an intrinsic semiconductor layer of amorphous silicon between the P+ doping semiconductor region and the N+ doping semiconductor region.

Referring to FIGS. 1 to 3 again, among the stack of layers of the semiconductor junction SJ, the first polarity semiconductor layer 31 is closest to the base substrate 10, the intrinsic semiconductor layer 32 is on a side of the first polarity semiconductor layer 31 away from the base substrate 10, and the second polarity semiconductor layer 33 is on a side of the intrinsic semiconductor layer 32 away from the first polarity semiconductor layer 31. Optionally, an orthographic projection of the intrinsic semiconductor layer 32 on the base substrate 10 substantially covers an orthographic projection of the first polarity semiconductor layer 31 on the base substrate 10. As used herein, the term "substantially covers" refers to one orthographic projection being at least 50% at least 60%, at least 70%, at least 80%, at least 90%, at least 95%, at least 99%, or 100% covered by another orthographic projection. Optionally, the orthographic projection of the intrinsic semiconductor layer 32 on the base substrate 10 completely covers the orthographic projection of the first polarity semiconductor layer 31 on the base substrate 10. Optionally, an orthographic projection of the second polarity semiconductor layer 33 on the base substrate 10 substantially covers the orthographic projection of the intrinsic semiconductor layer 32 on the base substrate 10. Optionally, an orthographic projection of the second polarity semiconductor layer 33 on the base substrate 10 completely covers the orthographic projection of the intrinsic semiconductor layer 32 on the base substrate 10.

Referring to FIGS. 1 to 3, in some embodiments, the photosensor further includes a first electrode 40 between the base substrate 10 and the first polarity semiconductor layer 31. Optionally, the first electrode 40 is a common electrode configured to be provided with a common voltage (e.g., a ground voltage) through a common voltage signal line. The photosensor in some embodiments includes a via V extending through the insulating layer 20. Optionally, the first electrode 40 is connected to the first polarity semiconductor layer 31 through the via V extending through the insulating layer 20.

In some embodiments, the photosensor further includes a substantially transparent conductive layer 50 on aside of the second polarity semiconductor layer 33 away from the base substrate 10. As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough. The substantially transparent conductive layer 50, directly or indirectly, connects the second polarity semiconductor layer 33 of the semiconductor junction SJ to the thin film transistor TFT (e.g., through a source electrode 74 of the thin film transistor TFT). Optionally, the substantially transparent conductive layer 50 encapsulates a lateral surface LS2 of the second polarity semiconductor layer 33, as shown in FIG. 3. Optionally, the substantially transparent conductive layer 50 encapsulates a lateral surface LS2 of the second polarity semiconductor layer 33 and a surface of the second polarity semiconductor layer 33 away from the base substrate 10 (e.g., the top surface of the second polarity semiconductor layer 33), as shown in FIG. 3. Optionally, a portion of the substantially transparent conductive layer 50 is in direct contact with the insulating layer 20. In one example, a portion of the substantially transparent conductive layer 50 is in direct contact with the insulating layer 20 in a region substantially surrounding the semiconductor junction SJ, thereby encapsulating the semiconductor junction SJ.

In some embodiments, the photosensor further includes a second electrode 60 connected to the second polarity semiconductor layer 33 through the substantially transparent conductive layer 50. Referring to FIGS. 1 to 3, in some embodiments, an orthographic projection of the second electrode 60 on the base substrate 10 substantially surrounds an orthographic projection of the semiconductor junction SJ on the base substrate 10. As used herein, the term "substantially surrounding" refers to surrounding at least 50% (e.g., at least 60%, at least 70%, at least 80%, at least 90%, at least 95%, at least 99%, and 100%) of a perimeter of an area. Optionally, the orthographic projection of the second electrode 60 on the base substrate 10 is partially overlapping with the orthographic projection of the semiconductor junction SJ on the base substrate 10. Optionally, the orthographic projection of the second electrode 60 on the base substrate 10 is substantially non-overlapping with the orthographic projection of the semiconductor junction SJ on the base substrate 10, to maximize light transmission into the semiconductor junction SJ. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping.

Various appropriate substantially transparent conductive materials may be used for making the substantially transparent conductive layer 50. Examples of appropriate substantially transparent conductive materials for making the substantially transparent conductive layer 50 include substantially transparent oxides (such as indium tin oxide (ITO), indium zinc oxide (IZO), aluminum zinc oxide (AZO), and zinc oxide (ZnO)) and substantially transparent metal layers (such as nano-silver).

Various appropriate substantially polarity semiconductor materials may be used for making the second polarity semiconductor layer 33. Examples of appropriate polarity semiconductor materials for making the second polarity semiconductor layer 33 include P+ doping semiconductor (such as P+ doping amorphous silicon), N+ doping semiconductor (such as N+ doping amorphous silicon) and various appropriate oxide semiconductor material. In one example, the second polarity semiconductor layer 33 includes indium gallium tin oxide, which has a relatively wide forbidden band (e.g., as compared to amorphous silicon) and functions as a filter to filter out noise photo signals, thereby enhancing the signal noise ratio of the photosensor.

Various appropriate substantially polarity semiconductor materials may be used for making the first polarity semiconductor layer 31. Examples of appropriate polarity semiconductor materials for making the first polarity semiconductor layer 31 include P+ doping semiconductor (such as P+ doping amorphous silicon) and N+ doping semiconductor (such as N+ doping amorphous silicon).

Various appropriate substantially semiconductor materials may be used for making the intrinsic semiconductor layer 32. Examples of appropriate semiconductor materials for making the intrinsic semiconductor layer 32 include amorphous silicon. Optionally, the intrinsic semiconductor layer 32 has a thickness in a range of 20 nm to 2 µm. Optionally, the intrinsic semiconductor layer 32 has a width in a range of 0.5 µm to 50 µm.

Referring to FIGS. 1, 2, and 4, the photosensor in some embodiments further includes a thin film transistor TFT electrically connected to the photodiode. The thin film transistor TFT includes a gate electrode 71, a gate insulating layer (optionally the same as the insulating layer 20), an active layer 72, a drain electrode 73, and a source electrode 74. Optionally, the insulating layer 20 constitutes the gate insulating layer for the thin film transistor TFT. The source electrode 74 is electrically connected to the second polarity semiconductor layer 33, e.g., through the substantially transparent conductive layer 50.

In some embodiments, the gate electrode 71 and the first electrode 40 are in a same layer and made of a same material. Optionally, the gate electrode 71 and the first electrode 40 are patterned in a same patterning process using a single mask plate. Optionally, the gate electrode 71, a gate line connected to the gate electrode 71, and the first electrode 40 are in a same layer and made of a same material. Optionally, the gate electrode 71, a gate line connected to the gate electrode 71, and the first electrode 40 are patterned in a same patterning process using a single mask plate.

In some embodiments, the active layer 72 and the second polarity semiconductor layer 33 are in a same layer and made of a same material. Optionally, the active layer 72 and the second polarity semiconductor layer 33 are patterned in a same patterning process using a single mask plate.

In some embodiments, the substantially transparent conductive layer 50 covers a source electrode contact region and a drain electrode contact region of the active layer 72, as shown in FIGS. 1 to 2. Optionally, in the source electrode contact region and a drain electrode contact region of the active layer 72, the substantially transparent conductive layer 50 is between the active layer 72 and the source electrode 74, and between the active layer 72 and the drain electrode 73.

In some embodiments, the source electrode 74, the drain electrode 73, and the second electrode 60 are in a same layer and made of a same material. Optionally, the source electrode 74, the drain electrode 73, and the second electrode 60 are patterned in a same patterning process using a single mask plate. Optionally, the source electrode 74 and the second electrode 60 are connected to each other. Optionally, the source electrode 74 and the second electrode 60 constitute an integral structure.

In some embodiments, the photosensor further includes a protective layer 75 covering a channel region of the active layer 72. In one example, the protective layer 75 is an etch stop layer for protecting the active layer 72 during patterning the source electrode 74 and the drain electrode 73.

Figure 6:
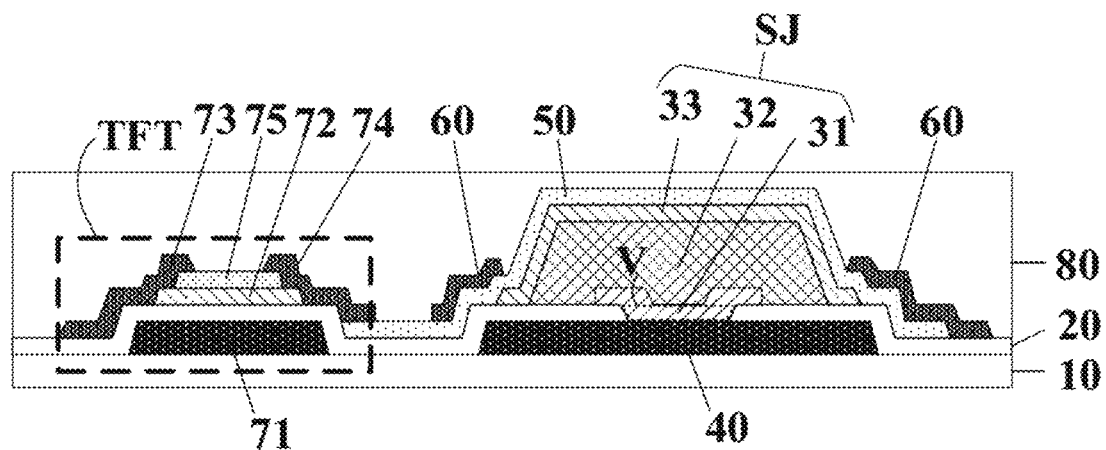
FIG. 6 is a cross-sectional view of a photosensor in some embodiments according to the present disclosure.

FIG. 6 is a cross-sectional view of a photosensor in some embodiments according to the present disclosure. Referring to FIG. 6, in some embodiments, the source electrode 74 and the second electrode 60 do not form an integral structure, but rather are spaced apart from each other. The substantially transparent conductive layer 50 optionally does not extend into the source electrode contact region and the drain electrode contact region of the active layer 72. The substantially transparent conductive layer 50, however, extends to a region between the source electrode 74 and the second electrode 60, and is in direct contact with the source electrode 74 and in direct contact with the second electrode 60, thereby electrically connecting the source electrode 74 and the second electrode 60 together.

Figure 7:
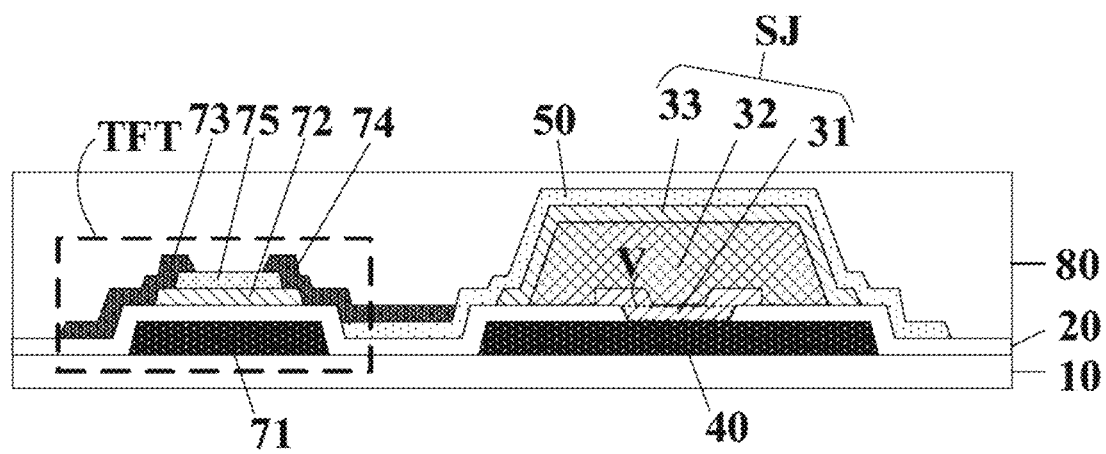
FIG. 7 is a cross-sectional view of a photosensor in some embodiments according to the present disclosure.

FIG. 7 is a cross-sectional view of a photosensor in some embodiments according to the present disclosure. Referring to FIG. 7, in some embodiments, the second electrode 60 is absent in the photosensor. The substantially transparent conductive layer 50 is connected to the source electrode 74, conducting the photocurrent to the source electrode 74.

Figure 8:
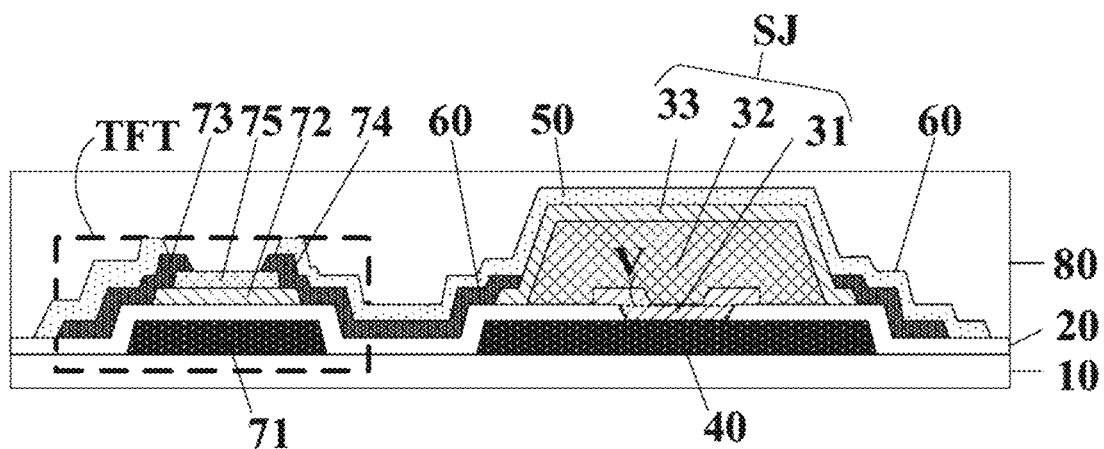
FIG. 8 is a cross-sectional view of a photosensor in some embodiments according to the present disclosure.

FIG. 8 is a cross-sectional view of a photosensor in some embodiments according to the present disclosure. Referring to FIG. 8, in some embodiments, the substantially transparent conductive layer 50 is on a side of the second electrode 60 away from the base substrate 10. Optionally, the substantially transparent conductive layer 50 is on a side of the source electrode 74, the drain electrode 73, and the second electrode 60, away from the base substrate 10.

Optionally, the first polarity semiconductor layer 31 is a P+ doping semiconductor layer. Optionally, the first polarity semiconductor layer 31 is an N+ doping semiconductor layer.

In some embodiments, the first polarity semiconductor layer 31 is electrically connected to a common electrode (see, e.g., FIGS. 1, 2, 3, and 6-8).

Figure 9:
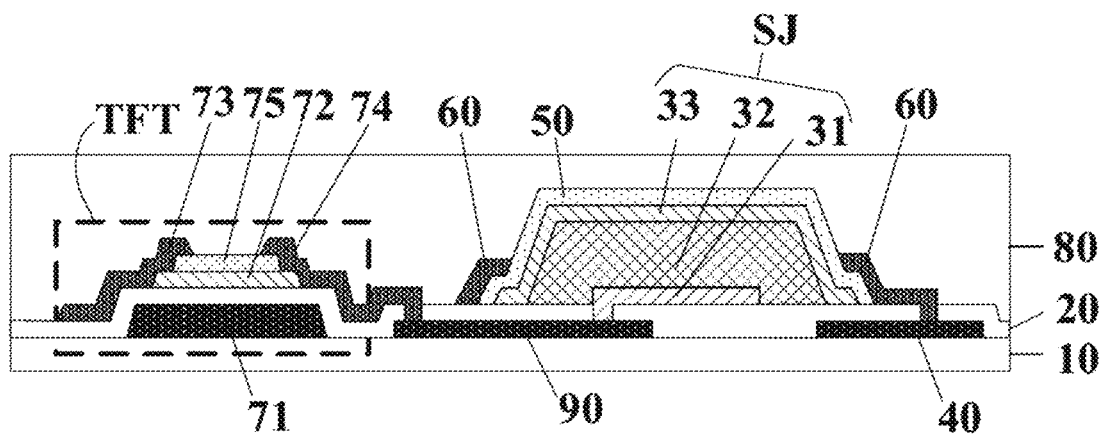
FIG. 9 is a cross-sectional view of a photosensor in some embodiments according to the present disclosure.

In some embodiments, the second polarity semiconductor layer 33 is electrically connected to a common electrode. FIG. 9 is a cross-sectional view of a photosensor in some embodiments according to the present disclosure. Referring to FIG. 9, in some embodiments, the second polarity semiconductor layer 33 is electrically connected to a common electrode. Specifically, the second polarity semiconductor layer 33 is electrically connected to a first electrode 40 through the substantially transparent conductive layer 50 and the second electrode 60. Optionally, the first electrode 40 is a common electrode configured to be provided with a common voltage (e.g., a ground voltage). The second electrode 60 is electrically connected to the first electrode 40 through a via extending through the insulating layer 20. The second electrode 60 is spaced apart from the source electrode 74, e.g., not connected. The first polarity semiconductor layer 31 is electrically connected to the source electrode 74 of the thin film transistor TFT. In one example, the first polarity semiconductor layer 31 is connected to a connecting bridge 90 between the insulating layer 20 and the base substrate 10 through a via extending through the insulating layer 20, and the source electrode 74 is connected to the connecting bridge 90 through a via extending through the insulating layer 20. The connecting bridge 90 connects the source electrode 74 and the first polarity semiconductor layer 31.

Optionally, the thin film transistor TFT is a bottom gate-type thin film transistor. Optionally, the thin film transistor TFT is a top gate-type thin film transistor.

In another aspect, the present disclosure provides a biometric sensor including a photosensor described herein or fabricated by a method described herein. Examples of biometric sensors include a fingerprint sensor and a palmprint sensor.

In another aspect, the present disclosure provides a display apparatus including a photosensor described herein or fabricated by a method described herein. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a photosensor. In some embodiments, the method includes forming an insulating layer on a base substrate; and forming a semiconductor junction on a side of the insulating layer away from the base substrate. In some embodiments, forming the semiconductor junction includes forming a first polarity semiconductor layer on the insulating layer; forming an intrinsic semiconductor layer on a side of the first polarity semiconductor layer away from the insulating layer; and forming a second polarity semiconductor layer on a side of the intrinsic semiconductor layer away from the first polarity semiconductor layer. Optionally, the second polarity semiconductor layer is formed to encapsulate a lateral surface of the intrinsic semiconductor layer.

Optionally, the second polarity semiconductor layer is formed to be in direct contact with the insulating layer. Optionally, the intrinsic semiconductor layer is formed so that an intermediate surface of the intrinsic semiconductor layer is in direct contact with the insulating layer. The intermediate surface of the intrinsic semiconductor layer connects the first polarity semiconductor layer and the second polarity semiconductor layer. Optionally, the semiconductor junction is formed so that an orthographic projection of the intrinsic semiconductor layer on the base substrate completely covers an orthographic projection of the first polarity semiconductor layer on the base substrate; and an orthographic projection of the second polarity semiconductor layer on the base substrate completely covers the orthographic projection of the intrinsic semiconductor layer on the base substrate.

In some embodiments, the method further includes forming a first electrode between the base substrate and the first polarity semiconductor layer. Optionally, the first electrode is connected to the first polarity semiconductor layer through a via extending through the insulating layer.

In some embodiments, the method further includes forming a substantially transparent conductive layer on a side of the second polarity semiconductor layer away from the base substrate. Optionally, the substantially transparent conductive layer is formed to encapsulate a lateral surface of the second polarity semiconductor layer.

In some embodiments, the method further includes forming a second electrode connected to the second polarity semiconductor layer through the substantially transparent conductive layer. Optionally, the second electrode is formed so that an orthographic projection of the second electrode on the base substrate substantially surrounds an orthographic projection of the semiconductor junction on the base substrate. Optionally, the second electrode is formed so that the orthographic projection of the second electrode on the base substrate is substantially non-overlapping with the orthographic projection of the semiconductor junction on the base substrate.

In some embodiments, the method further includes forming a transistor connected to the photodiode. Optionally, forming the transistor includes forming a gate electrode, forming a gate insulating layer, forming an active layer, forming a source electrode, and forming a drain electrode. Optionally, the insulating layer is the gate insulating layer. Optionally, the first electrode and the gate electrode are formed in a same layer using a same material, and are patterned in a same patterning process using a single mask plate. Optionally, the active layer and the second polarity semiconductor layer are formed in a same layer using a same material, and are patterned in a same patterning process using a single mask plate. Optionally, the source electrode, the drain electrode, and the second electrode are formed in a same layer using a same material, and are patterned in a same patterning process using a single mask plate. Optionally, the source electrode and the second electrode are formed to be connected to each other. Optionally, the source electrode and the second electrode are formed as an integral structure. Optionally, the substantially transparent conductive layer is formed to cover a source electrode contact region and a drain electrode contact region of the active layer.

In some embodiments, the method further includes forming a protective layer covering a channel region of the active layer.

In some embodiments, the source electrode and the second electrode are not formed as an integral structure, but rather are formed to be spaced apart from each other. Optionally, the substantially transparent conductive layer is formed outside the source electrode contact region and the drain electrode contact region of the active layer. The substantially transparent conductive layer is formed to extend to a region between the source electrode and the second electrode, and is formed to be in direct contact with the source electrode and in direct contact with the second electrode, thereby electrically connecting the source electrode and the second electrode together.

In some embodiments, the second electrode is not formed in the photosensor. The substantially transparent conductive layer is formed to be connected to the source electrode, conducting the photocurrent to the source electrode.

In some embodiments, the substantially transparent conductive layer is formed on a side of the second electrode away from the base substrate. Optionally, the substantially transparent conductive layer is formed on a side of the source electrode, the drain electrode, and the second electrode, away from the base substrate.

In some embodiments, the first polarity semiconductor layer is formed to be electrically connected to a common electrode.

In some embodiments, the second polarity semiconductor layer is formed to be electrically connected to a common electrode. Optionally, the second polarity semiconductor layer is formed to be electrically connected to a first electrode through the substantially transparent conductive layer and the second electrode. Optionally, the first electrode is formed as a common electrode configured to be provided with a common voltage (e.g., a ground voltage). The second electrode is formed to be electrically connected to the first electrode through a via extending through the insulating layer. The second electrode is formed to be spaced apart from the source electrode. The first polarity semiconductor layer is formed to be electrically connected to the source electrode of the thin film transistor.

In one example, the method further includes forming a connecting bridge on the base substrate and on a side of the insulating layer closer to the base substrate. Optionally, the first polarity semiconductor layer is formed to be connected to the connecting bridge through a via extending through the insulating layer, and the source electrode is formed to be connected to the connecting bridge through a via extending through the insulating layer. The connecting bridge is formed to connect the source electrode and the first polarity semiconductor layer.

In some embodiments, the method includes forming the gate electrode and a first electrode in a same layer using a same material and a single mask plate; forming the insulating layer on a side of the gate electrode and the first electrode away from the base substrate; forming a via extending through the insulating layer; forming the first polarity semiconductor layer on a side of the insulating layer away from the first electrode, the first polarity semiconductor layer formed to be connected to the first electrode through the via extending through the insulating layer; forming the intrinsic semiconductor layer on a side of the first polarity semiconductor layer away from the insulating layer; forming the second polarity semiconductor layer and the active layer in a same layer using a same material and a single mask plate, the active layer formed to be on a side of the insulating layer away from the gate electrode, the second polarity semiconductor layer formed to be on a side of the intrinsic semiconductor layer away from the first polarity semiconductor layer; forming a substantially transparent conductive layer on a side of the second polarity semiconductor layer, and a source electrode contact region and a drain electrode contact region of the active layer, away from the insulating layer; and forming the source electrode, the drain electrode, and a second electrode in a same layer using a same material and a single mask plate, the second electrode formed to be connected to the second polarity semiconductor layer through the substantially transparent conductive layer. Optionally, the second electrode is formed so that an orthographic projection of the second electrode on the base substrate substantially surrounds an orthographic projection of the semiconductor junction on the base substrate.

Figure 10A:
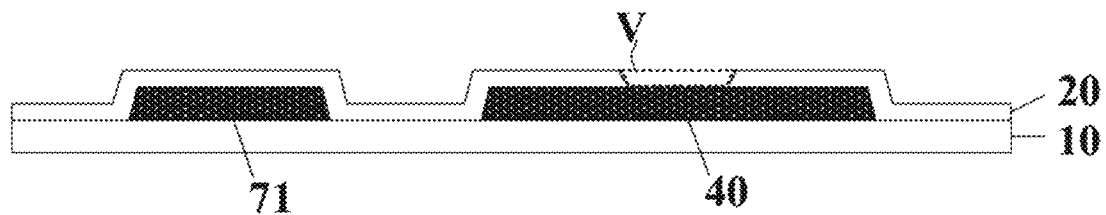
FIGS. 10A to 10F illustrate a process of fabricating a photosensor in some embodiments according to the present disclosure.

FIGS. 10A to 10F illustrate a process of fabricating a photosensor in some embodiments according to the present disclosure. Referring to FIG. 10A, a gate electrode 71 and a first electrode 40 are formed on the base substrate 10, an insulating layer 20 is formed on a side of the gate electrode 71 and the first electrode 40 away from the base substrate 10. A via V is formed to extend through the insulating layer 20 in a region corresponding to the first electrode 40 (e.g., corresponding to a central region of the first electrode 40).

Figure 10B:
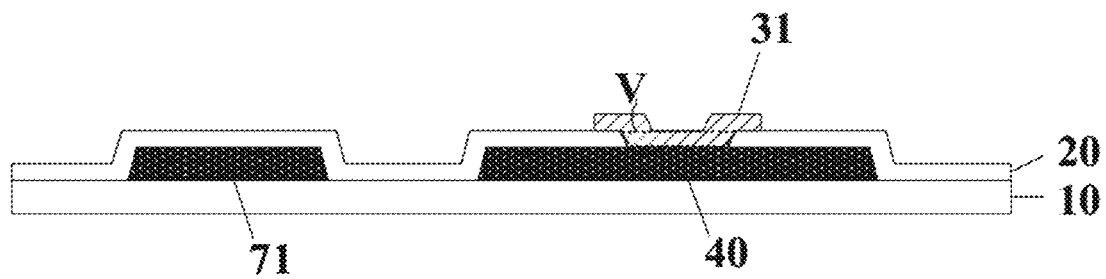

Referring to FIG. 10B, a first polarity semiconductor layer 31 is formed on aside of the insulating layer 20 away from the first electrode 40. The first polarity semiconductor layer 31 is formed to be electrically connected to the first electrode 40 through the via V.

Figure 10C:
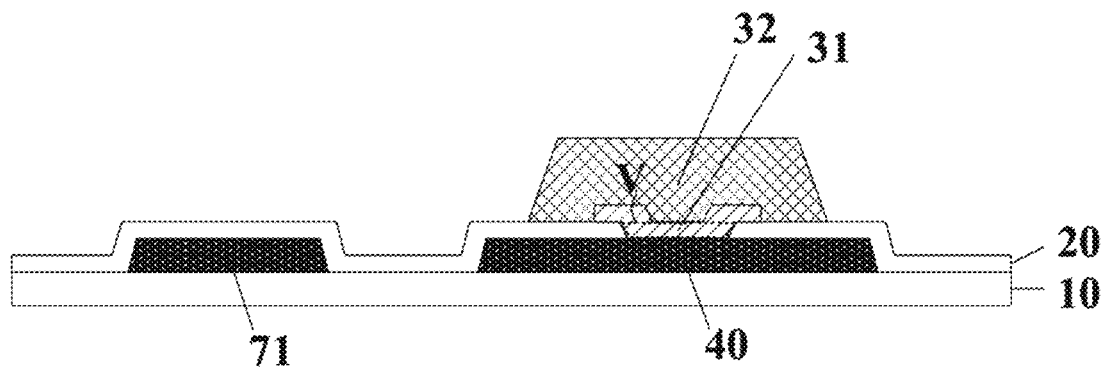

Referring to FIG. 10C, an intrinsic semiconductor layer 32 is formed on aside of the first polarity semiconductor layer 31 away from the base substrate 10. Optionally, the intrinsic semiconductor layer 32 is formed so that an orthographic projection of the intrinsic semiconductor layer 32 on the base substrate 10 completely covers an orthographic projection of the first polarity semiconductor layer 31 on the base substrate 10.

Figure 10D:
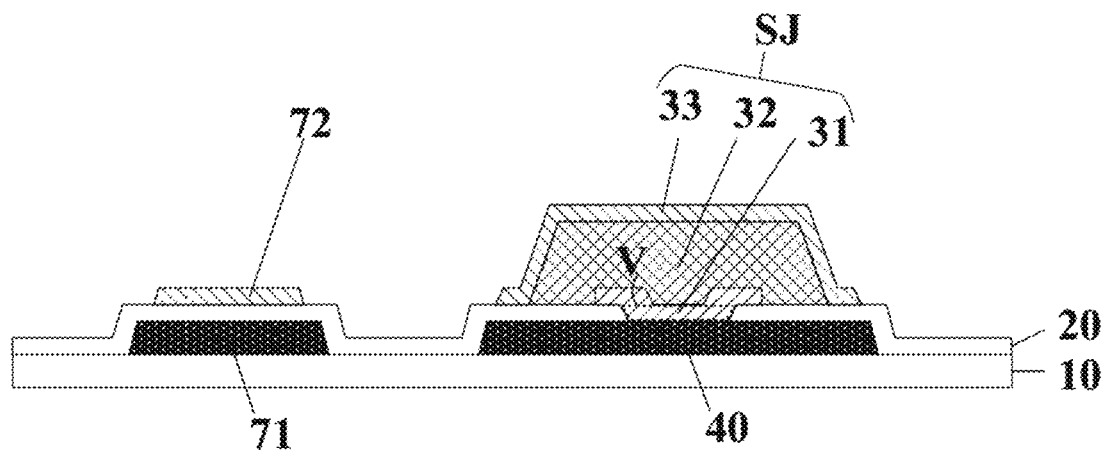

Referring to FIG. 10D, an active layer 72 is formed on a side of the insulating layer 20 away from the base substrate 10, and a second polarity semiconductor layer 33 is formed on a side of the intrinsic semiconductor layer 32 away from the base substrate 10. The active layer 72 and the second polarity semiconductor layer 33 are formed in a same patterning process.

Figure 10E:
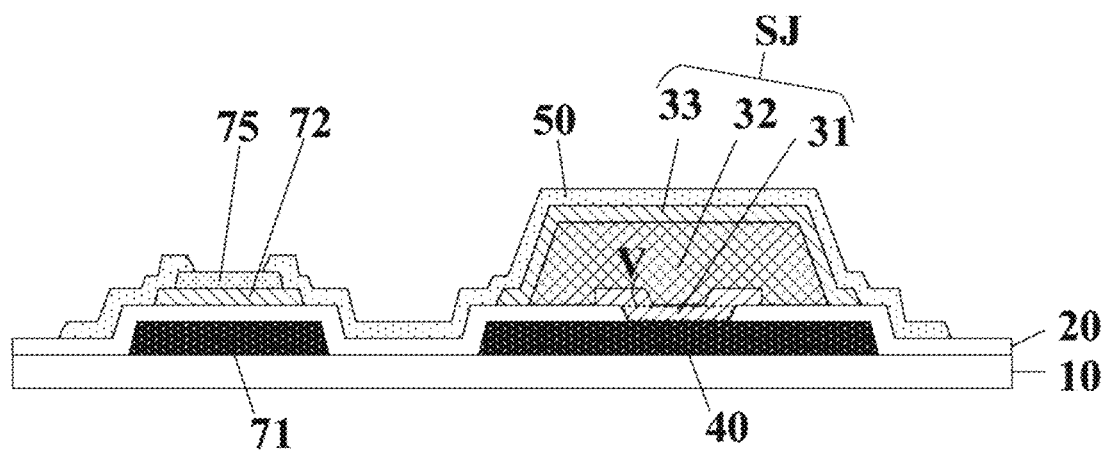

Referring to FIG. 10E, a protective layer 75 is formed on aside of a channel region of the active layer 72 away from the base substrate 10, and a substantially transparent conductive layer 50 is formed on a side of the second polarity semiconductor layer 33 away from the base substrate 10. The substantially transparent conductive layer 50 is formed to encapsulate a lateral surface of the second polarity semiconductor layer 33, and cover a source electrode contact region and a drain electrode contact region of the active layer 72.

Figure 10F:
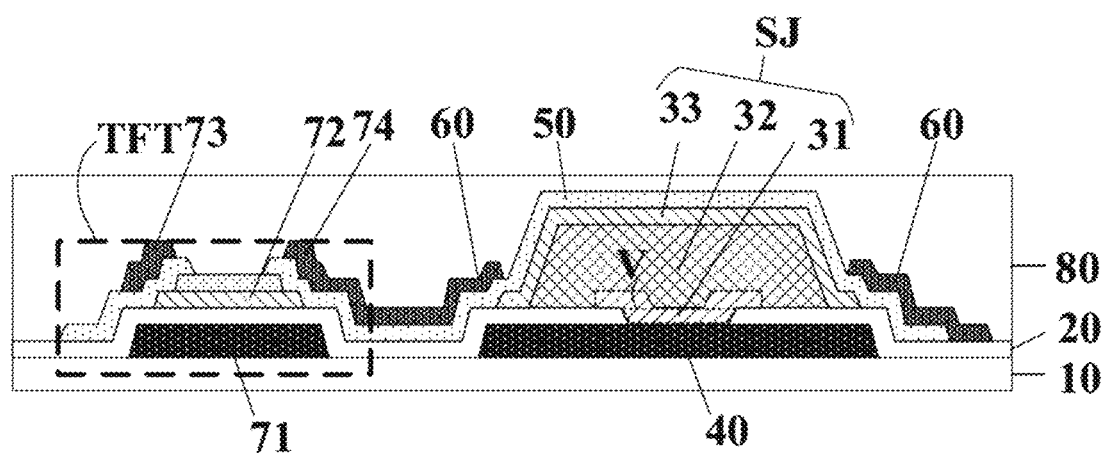

Referring to FIG. 10F, a source electrode 74, a drain electrode 73, and a second electrode 60 are then formed on a side of the substantially transparent conductive layer 50 away from the base substrate 10. The second electrode 60 is formed to be connected to the second polarity semiconductor layer 33 through the substantially transparent conductive layer 50. An orthographic projection of the second electrode 60 on the base substrate 10 substantially surrounds an orthographic projection of the semiconductor junction SJ on the base substrate 10. The orthographic projection of the second electrode 60 on the base substrate 10 is substantially non-overlapping with the orthographic projection of the semiconductor junction SJ on the base substrate 10. The source electrode 74 and the second electrode 60 are formed as an integral structure.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A photosensor, comprising:
   a base substrate;
   an insulating layer on the base substrate;
   a photodiode comprising a semiconductor junction on a side of the insulating layer away from the base substrate, the semiconductor junction comprising a first polarity semiconductor layer, an intrinsic semiconductor layer, and a second polarity semiconductor layer stacked on the insulating layer, wherein the second polarity semiconductor layer encapsulates a lateral surface of the intrinsic semiconductor layer;
   a substantially transparent conductive layer on a side of the second polarity semiconductor layer away from the base substrate; and
   a second electrode connected to the second polarity semiconductor layer through the substantially transparent conductive layer;
   wherein the substantially transparent conductive layer encapsulates a lateral surface of the second polarity semiconductor layer; and
   an orthographic projection of the second electrode on the base substrate substantially surrounds an orthographic projection of the semiconductor junction on the base substrate.

2. The photosensor of claim 1, wherein the second polarity semiconductor layer is in direct contact with the insulating layer.

3. The photosensor of claim 1, wherein an intermediate surface of the intrinsic semiconductor layer is in direct contact with the insulating layer; and
   the intermediate surface of the intrinsic semiconductor layer connects the first polarity semiconductor layer and the second polarity semiconductor layer.

4. The photosensor of claim 1, wherein: an orthographic projection of the intrinsic semiconductor layer on the base substrate completely covers an orthographic projection of the first polarity semiconductor layer on the base substrate; and
   an orthographic projection of the second polarity semiconductor layer on the base substrate completely covers the orthographic projection of the intrinsic semiconductor layer on the base substrate.

5. The photosensor of claim 1, further comprising a first electrode between the base substrate and the first polarity semiconductor layer;
   wherein the first electrode is connected to the first polarity semiconductor layer through a via extending through the insulating layer.

6. The photosensor of claim 1, wherein the orthographic projection of the second electrode on the base substrate is substantially non-overlapping with the orthographic projection of the semiconductor junction on the base substrate.

7. The photosensor of claim 1, wherein the second polarity semiconductor layer is made of an oxide semiconductor material.

8. The photosensor of claim 1, wherein the first polarity semiconductor layer is a P+doping semiconductor layer, the second polarity semiconductor layer is an N+doping semiconductor layer, and the semiconductor junction is an intrinsic region of amorphous silicon between the P+doping semiconductor region and the N+doping semiconductor region.

9. A display apparatus, comprising the photosensor of claim 1, and a plurality of subpixels for image display.

10. A photosensor, comprising:
a base substrate;
an insulating layer on the base substrate;
a photodiode comprising a semiconductor junction on a side of the insulating layer away from the base substrate, the semiconductor junction comprising a first polarity semiconductor layer, an intrinsic semiconductor layer, and a second polarity semiconductor layer stacked on the insulating layer, wherein the second polarity semiconductor layer encapsulates a lateral surface of the intrinsic semiconductor layer; and
a transistor connected to the photodiode;
wherein the transistor comprises a gate electrode, a gate insulating layer, an active layer, a source electrode, and a drain electrode;
the insulating layer is the gate insulating layer; and
the active layer and the second polarity semiconductor layer are in a same layer and comprise a same material.

11. The photosensor of claim 10, further comprising a first electrode on the base substrate and on a side of the insulating layer away from the first polarity semiconductor layer;
wherein the first electrode is connected to the first polarity semiconductor layer through a via extending through the insulating layer; and
the first electrode and the gate electrode are in a same layer and comprise a same material.

12. The photosensor of claim 10, further comprising a substantially transparent conductive layer on a side of the second polarity semiconductor layer away from the semiconductor junction, and covering a source electrode contact region and a drain electrode contact region of the active layer;
wherein the substantially transparent conductive layer encapsulates a lateral side of the second polarity semiconductor layer.

13. The photosensor of claim 12, further comprising a second electrode connected to the second polarity semiconductor layer through the substantially transparent conductive layer;
wherein an orthographic projection of the second electrode on the base substrate substantially surrounds an orthographic projection of the semiconductor junction on the base substrate;
the source electrode, the drain electrode, and the second electrode are in a same layer and comprise a same material; and
the source electrode and the second electrode are connected to each other.

14. The photosensor of claim 13, wherein the source electrode and the second electrode constitute an integral structure.

15. The photosensor of claim 10, further comprising a protective layer covering a channel region of the active layer.

16. A method of fabricating a photosensor, comprising:
forming an insulating layer on a base substrate; and
forming a semiconductor junction on a side of the insulating layer away from the base substrate;
wherein forming the semiconductor junction comprises:
forming a first polarity semiconductor layer on the insulating layer;
forming an intrinsic semiconductor layer on a side of the first polarity semiconductor layer away from the insulating layer;
forming a second polarity semiconductor layer on a side of the semiconductor junction away from the first polarity semiconductor layer;
forming a substantially transparent conductive layer on a side of the second polarity semiconductor layer away from the base substrate; and
forming a second electrode connected to the second polarity semiconductor layer through the substantially transparent conductive layer;
wherein the second polarity semiconductor layer is formed to encapsulate a lateral side of the intrinsic semiconductor layer;
the substantially transparent conductive layer encapsulates a lateral surface of the second polarity semiconductor layer; and
an orthographic projection of the second electrode on the base substrate substantially surrounds an orthographic projection of the semiconductor junction on the base substrate.

17. The method of claim 16, further comprising forming a transistor connected to the semiconductor junction;
wherein forming the transistor comprises forming a gate electrode, forming a gate insulating layer, forming an active layer, forming a source electrode, and forming a drain electrode; and
the insulating layer is the gate insulating layer;
wherein the method comprises:
forming the gate electrode and a first electrode in a same layer using a same material and a single mask plate;
forming the insulating layer on a side of the gate electrode and the first electrode away from the base substrate;
forming a via extending through the insulating layer;
forming the first polarity semiconductor layer on a side of the insulating layer away from the first electrode, the first polarity semiconductor layer formed to be connected to the first electrode through the via extending through the insulating layer;
forming the semiconductor junction on a side of the first polarity semiconductor layer away from the insulating layer; and
forming the second polarity semiconductor layer and the active layer in a same layer using a same material and a single mask plate, the active layer formed to be on a side of the insulating layer away from the gate electrode, the second polarity semiconductor layer formed to be on a side of the semiconductor junction away from the first polarity semiconductor layer.

* * * * *